(12) United States Patent
Burns et al.

(10) Patent No.: US 11,934,671 B2
(45) Date of Patent: *Mar. 19, 2024

(54) STATUS MANAGEMENT IN STORAGE BACKED MEMORY PACKAGE

(71) Applicant: Micron Technology, Inc., Boise, ID (US)

(72) Inventors: Michael Burns, Maple Grove, MN (US); Gary R. Van Sickle, Arden Hills, MN (US); Jeffery J. Leyda, Minneapolis, MN (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/895,766

(22) Filed: Aug. 25, 2022

(65) Prior Publication Data

US 2022/0404992 A1 Dec. 22, 2022

Related U.S. Application Data

(63) Continuation of application No. 17/036,866, filed on Sep. 29, 2020, now Pat. No. 11,442,638, which is a
(Continued)

(51) Int. Cl.
*G06F 3/06* (2006.01)

(52) U.S. Cl.
CPC .......... *G06F 3/0634* (2013.01); *G06F 3/0604* (2013.01); *G06F 3/0637* (2013.01); *G06F 3/068* (2013.01)

(58) Field of Classification Search
None
See application file for complete search history.

(56) References Cited

U.S. PATENT DOCUMENTS 9,971,537 B1 * 5/2018 Kannan ................. G06F 3/0653
10,838,637 B2   11/2020 Burns et al.
(Continued)

FOREIGN PATENT DOCUMENTS

CN    102163133 B    7/2013
CN    106126447 A    11/2016
(Continued)

OTHER PUBLICATIONS

"Chinese Application Serial No. 201980017544.X, Office Action dated May 25, 2021", w/English translation, 12 pgs.
(Continued)

*Primary Examiner* — Charles J Choi
(74) *Attorney, Agent, or Firm* — Schwegman Lundberg & Woessner, P.A.

(57) ABSTRACT

Devices and techniques for status management in storage backed memory are disclosed herein. An encoded message can be received at a first interface of the memory package. Here, the memory package also includes a second interface to a host. The message can be decoded to obtain a decoded message that includes an attribute. The attribute can be compared a set of attributes that correspond to an advertised status of the memory package. The comparison enables a determination that the attribute is in the set of attributes. The advertised status of the memory package can then be modified in response to the determination that the attribute is in the set of attributes.

20 Claims, 5 Drawing Sheets

Related U.S. Application Data continuation of application No. 16/054,144, filed on Aug. 3, 2018, now Pat. No. 10,838,637.

(60) Provisional application No. 62/627,949, filed on Feb. 8, 2018.

(56) References Cited

U.S. PATENT DOCUMENTS

| | | | |
|---|---|---|---|
| 11,442,638 | B2 | 9/2022 | Burns et al. |
| 2005/0240738 | A1 | 10/2005 | Shirogane et al. |
| 2014/0068161 | A1 | 3/2014 | Yi et al. |
| 2015/0078057 | A1 | 3/2015 | Gillingham et al. |
| 2015/0149820 | A1 | 5/2015 | Song |
| 2016/0328156 | A1 | 11/2016 | Swarbrick et al. |
| 2017/0060706 | A1 | 3/2017 | Kinoshita |
| 2017/0102873 | A1 | 4/2017 | Hanson et al. |
| 2018/0024763 | A1 | 1/2018 | Kodera et al. |
| 2018/0032447 | A1 | 2/2018 | Kaplan et al. |
| 2018/0232320 | A1 | 8/2018 | Raval et al. |
| 2019/0243568 | A1 | 8/2019 | Burns et al. |
| 2021/0026549 | A1 | 1/2021 | Burns et al. |

FOREIGN PATENT DOCUMENTS

| | | |
|---|---|---|
| CN | 106484571 A | 3/2017 |
| CN | 111886572 A | 11/2020 |
| CN | 111886572 | 5/2022 |
| CN | 114816259 | 7/2022 |
| KR | 20170012675 A | 2/2017 |
| TW | 201712550 A | 4/2017 |
| TW | 201945920 A | 12/2019 |
| WO | WO-2019156883 A1 | 8/2019 |

OTHER PUBLICATIONS

"Chinese Application Serial No. 201980017544.X, Office Action dated Nov. 3, 2021", w/English translation, 8 pgs.

"Chinese Application Serial No. 201980017544.X, Response filed Jan. 7, 2022 to Office Action dated Nov. 3, 2021", w/English Claims, 16 pgs.

"Chinese Application Serial No. 201980017544.X, Response filed Sep. 2, 2021 to Office Action dated Nov. 3, 2021", w/ English Claims, 19 pgs.

"Chinese Application Serial No. 201980017544.X, Voluntary Amendment filed Feb. 24, 2021", w/ English Claims, 23 pgs.

"European Application Serial No. 19750433.5, Extended European Search Report dated Sep. 23, 2021", 9 pgs.

"European Application Serial No. 19750433.5, Response filed Mar. 25, 2021 to Communication pursuant to Rules 161(2) and 162 EPC dated Sep. 15, 2021", 11 pgs.

"International Application Serial No. PCT/US2019/016009, International Preliminary Report on Patentability dated Aug. 20, 2020", 7 pgs.

"International Application Serial No. PCT/US2019/016009, International Search Report dated May 21, 2019", 3 pgs.

"International Application Serial No. PCT/US2019/016009, Written Opinion dated May 21, 2019", 5 pgs.

"Taiwanese Application Serial No. 108104311, Office Action dated Nov. 29, 2019", w/ English Translation, 15 pgs.

"Taiwanese Application Serial No. 108104311, Response filed Feb. 13, 2020 to Office Action dated Nov. 29, 2019", w/ English Claims, 42 pgs.

"Chinese Application Serial No. 201980017544.X, Response filed Jan. 21, 2022 to Examiner Telephone Interview dated Jan. 19, 2022", with English claims, 15 pages.

* cited by examiner

STATUS MANAGEMENT IN STORAGE BACKED MEMORY PACKAGE

PRIORITY APPLICATION

This application is a continuation of U.S. application Ser. No. 17/036,866, filed Sep. 29, 2020, which is a continuation of U.S. application Ser. No. 16/054,144, filed Aug. 3, 2018, now issued as U.S. Pat. No. 10,838,637, which claims the benefit of priority to U.S. Provisional Application Ser. No. 62/627,949, filed Feb. 8, 2018, all of which are incorporated herein by reference in their entirety.

BACKGROUND

Memory devices are typically provided as internal, semiconductor, integrated circuits in computers or other electronic devices. There are many different types of memory, including volatile and non-volatile memory. Memory devices store data for other components. Byte addressable memory devices can be directly used by processors or other components to store both current state data as well as data not directly connected to a current system state. Block addressable devices, such as hard disk drives, are storage devices that are generally not directly usable by system components to store state information. Often, a memory device serves as an intermediary, where block addressed data is loaded into the memory device before use by the system.

Volatile memory requires power to maintain its data, and includes random-access memory (RAM), dynamic random-access memory (DRAM), or synchronous dynamic random-access memory (SDRAM), among others. Volatile memory devices are widely deployed in computing systems. Generally, these devices are byte addressable and thus directly accessible from processors, unlike storage devices that are addressable in pages, blocks, etc. Volatile memories like SRAM and DRAM are also fast enough to satisfy user expectations for device performance.

While the power-dependent nature of volatile memories is not an issue under many circumstances, there are instances in which the loss of data, such as system state data, uncommitted transactions, etc., can be problematic. In these circumstances, losing power to the volatile memory can mean corrupted data or an inability to diagnose a problem because the evidence of the problem is lost when the volatile memory powers down. To address these instances, a variety of techniques have been tried. For example, battery backed RAMs use a secondary independent power source, a battery, to maintain the volatile memory contents in case the primary power source ceases to function. Battery backed RAMs had limited effectiveness due to the limited duration of the storage (e.g., when the battery could no longer provide power the contents were lost).

Non-volatile dual in-line memory modules (NVDIMMs) combine a popular volatile memory package family of standards (DIMMs) with non-volatile storage, such as NAND flash, to provide power-off retention of volatile memory contents for extended periods of time. The Joint Electron Device Engineering Council (JEDEC) has promulgated several standards pertaining to DIMMs, including Double Data Rate (DDR) memory interfaces and NVDIMMs that use DDR interfaces. NVDIMM-N is a family of JEDEC standards in which a DIMM includes flash storage and a controller in addition to DRAM or SRAM volatile memories. JEDEC standard 245B.01 (JESD245B.05) for Byte Addressable Energy Backed Interface (BAEBI) provides a number of implementation and interaction details with an example of a NVDIMM.

BRIEF DESCRIPTION OF THE DRAWINGS

The present disclosure is illustrated by way of example and not limitation in the figures of the accompanying drawings, in which like references indicate similar elements.

DETAILED DESCRIPTION

Figure 1:
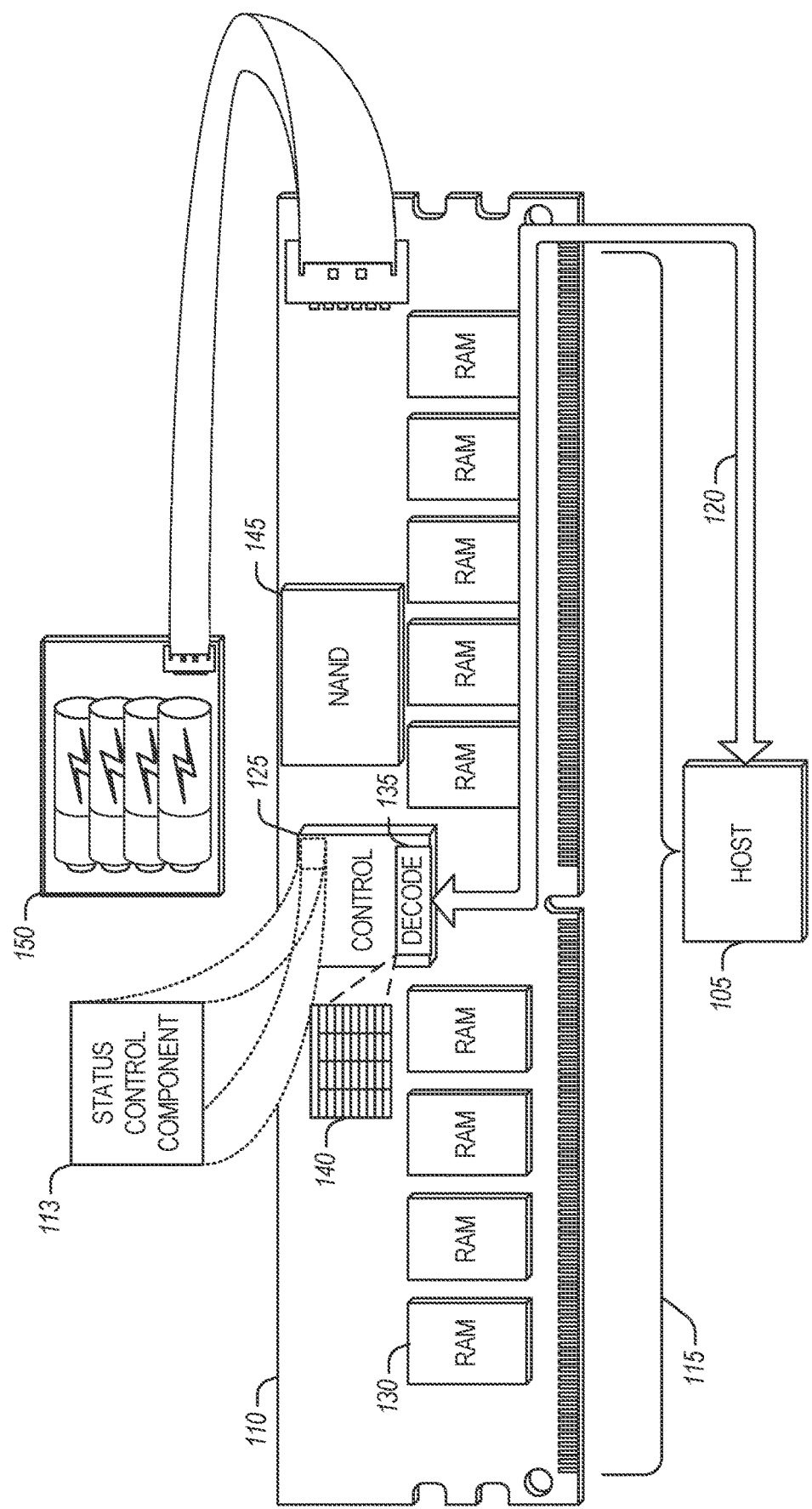
FIG. 1 illustrates an example of a NVDIMM implementing status management, in accordance with some implementations of the present disclosure.

The following discussion is generally directed toward storage backed memory packages that conform to the NVDIMM-N family of standards. However, other storage backed memory packages can also benefit from the devices and techniques described below. As noted above, NVDIMM-N devices locate a NAND flash device on the module. A controller is also included on the module. The controller is generally an application specific integrated circuit (ASIC), a field programmable gate array (FPGA), or other processing circuitry, arranged or programmed to manage data transfers between the DRAM or SDRAM volatile portion of the module to the flash non-volatile portion (e.g., the storage backing the DRAM or SDRAM memory). Often, the controller optimized for energy, space (e.g., die size), or process (e.g., using larger feature sizes) efficiency instead of computational speed. NVDIMM-N devices include two interfaces, a DDR version 4 (DDR4) memory interface to enable a host (e.g., processor) to use the module for system memory, and an Inter-Integrated Circuit (I2C, I²C, or IIC) bus to enable the host to communicate directly to the controller.

I2C is a packet switched bus that uses a two-wire connection (e.g., one wire for the clock signal and one wire for the data signal), and supports a one megahertz data rate. Thus, I2C provides a flexible and efficient addition to many discrete integrated circuits within a system. However, I2C is quite slow when compared to the DDR4 memory interface, with I2C having either a 100 or 400 kilobits (Kbits) per second throughput and DDR4 having data rates between 1,600-3,200 megabits (Mbits) per second throughput. Host communication with the controller over I2C generally involves reading and writing registers of the controller. For example, a host can issue a partial save command to the controller by setting beginning and end address registers and actuating a save register via I2C.

Some NVDIMM-N I2C protocols, such as those defined in the BAEBI 2.1-1 standard, have implicit predicate (e.g., happens-before) requirements that, if not accounted for, make reliably-correct communications problematic. For example, the Catastrophic Save workflow proceeds as follows:

1. The host waits for the "Operation in Progress" bit in the NVDIMM_CMD_STATUS0 register to be clear. This can be accomplished via an I2C read poll by the host (e.g., the host periodically checks the register value via the I2C) interface.
2. The host then sets bit two (e.g., Clear the CSAVE_STATUS register) in the NVDIMM_MGT_CMD0 register. This is a Host I2C write command to clear the status register. Here, there is no requirement that the host wait for any sort of response; meaning that this is a blind write.
3. The host then sets the START_CSAVE bit in the NVDIMM_FUNC_CMD register. This is another blind Host I2C write, because the host does not wait for a response. The controller required to set the "corresponding In Progress bit in NVDIMM_CMD_STATUS0".
4. The host then checks the Catastrophic Save In Progress bit in the NVDIMM_CMD_STATUS0 register. If this check is clear, the host checks the CSAVE_STATUS register. If the CSAVE_STATUS register does not indicate that the Catastrophic Save operation is done, the host retries operation 3. The setting of the Catastrophic Save In Progress bit by the controller is intended to happen in operation 3, before the host's check for that bit in operation 4. However, as noted above, the controller is often not optimized for speed, and can be much slower than the host. This leads to a possible race condition in which the controller is not able to set the appropriate status bits in operation 3 before the host performs operation 4. Because the controller has not modified the in-progress bits, the host misinterprets the register values in operation 4 as completion of the catastrophic save by the controller when, in fact, the controller has not even gotten around to modifying the status to indicate that it has begun the operation. This misinterpretation of the controller status by the host can lead to several operational failures, such as the host not retrying an operation that has failed.

Aspects of the present disclosure are directed to status management in a storage backed memory, or memory sub-system (e.g., "memory device"). An example of a memory sub-system is a storage system, such as a solid-state drive (SSD). In some embodiments, the memory sub-system is a hybrid memory/storage sub-system. In general, a host system can utilize a memory sub-system that includes one or more memory components. The host system can provide data to be stored at the memory sub-system and can request data to be retrieved from the memory sub-system.

To address the race condition issue, the I2C bus interface for the controller is modified to inspect (e.g., snoop) on the host's messages and determine whether the packet implicates an operation that corresponds to an advertised status indication (e.g., a status indication that can be read outside of the storage backed memory package). The modification can be in a decoder for the I2C bus interface. If the message corresponds to an operation that corresponds to an advertised status indication (such as the catastrophic save and corresponding register bits described above), then the I2C bus interface sets the advertised status indication and provides the message to the controller. The controller then operates as usual, including clearing the advertised status indication when the controller completes the operation. This arrangement prevents the race condition by setting the "busy bit" for select operations before the host can re-read (e.g., test) the advertised status indication without regard to the speed with which the controller engages in completing the operation. Additional details and examples are described below.

FIG. 1. illustrates an example of a NVDIMM 110 implementing status management, in accordance with some implementations of the present disclosure. In an example, the NVDIMM 110 conforms to a JEDEC NVDIMM-N family of standards. The NVDIMM 110 includes a controller 125, a volatile storage portion 130, a non-volatile storage portion 145, a first interface 120 (e.g., an I2C bus), and a second interface 115 (e.g., a DDR interface). The volatile portion 130 includes one or more DRAM or SRAM integrated circuits (ICS) to store data for read or write operations of the host 105 via the second interface 115. The non-volatile storage portion 145 can be implemented in any storage technology that does not require power in order to maintain state. Example non-volatile storage technologies can include NAND flash, NOR flash, storage class memory (e.g., phase change memory), magnetic storage, and the like.

The first interface 120 is generally used by the host 105 to communicate directly with the controller 125 to perform a variety of operations. The controller 125 is arranged to implement these operations within the NVDIMM 110. The controller 125 is implemented as electronic hardware, such as an FPGA, ASIC, digital signal processor (DSP), or other processing circuitry, such as an example of the status control component 113 illustrated here. In an example, the controller executes instructions (e.g., firmware) on the electronic hardware to perform the operations. This is another example of the status control component 113 illustrated in FIG. 5. The BAEBI family of standards define a number of operations implemented by compliant devices.

When the first interface 120 is an I2C bus, typical communications involve the host 105 setting registers in the controller 125 via the first interface 120. For example, the host 105 can set a specific register such that a specific bit in that register is changed from a zero into a one. When this bit value change corresponds to execution of a command, the controller 125 performs the command in response to the bit modification. If the command has arguments, the host 105 can set the registers corresponding to the arguments. In this case, the controller 125 is arranged to check these argument registers to retrieve the data to complete the command.

As noted above, because the host 105 is likely implemented in a very fast processor, and the controller 125 is not optimized for speed, a race condition can occur in which the host 105—which periodically reads an advertised value (e.g., a register or a portion of a register) to determine whether a command has completed—attempts to read the advertised status after invoking a command before the controller 125 sets the advertised status in response to the command invocation. Here, the controller 125 is not fast enough to set the expected value of the advertised value before the host 105 performs the first check. When this occurs, the host 105 operates as if the command is completed when, in fact, the controller 125 has not even begun.

To address the race condition issue, the controller 125 is arranged to receive (e.g., at a decoder 135 of the controller 125) an encoded message over the first interface 120. Where the first interface 120 operates in accordance with an I2C family of standards, the message encoding is the I2C marketization of the message. The decoder 135 is arranged to obtain a decoded message that includes an attribute. In an example, the attribute is a name of a command. A command name can be in a payload of a packetized message. In an example, the attribute is an address. An address can be in a header of a packetized message. In an example, the address a page designator. In an example, the address includes both a page designator and an offset.

The decoder 135, or the controller 125, is arranged to compare the attribute to a set of attributes—that correspond to an advertised status of the memory package—to determine that the attribute is in the set of attributes. Here, advertised status means a status of the NVDIMM 110 that is observable outside of the NVDIMM 110. For example, a status bit (e.g., a "busy bit"), or register, that is readable by the host 105 is an advertised status. In an example, the advertised status indicates whether there is an operation in progress for the controller 125. In an example, the advertised status indicates a type of the operation that is in progress.

The attribute to set of attributes comparison can be implemented several ways. In an example, the set of attributes are stored in a table 140 or other data structure. Here, the decoder 135 or the controller 125 are arranged to match the attribute to a record in the table 140 to determine that the attribute is in the set of attributes. If no match exists, then the attribute does not correspond to an advertised status of the NVDIMM 110. In an example, the set of attributes are defined by the JEDEC BAEBI family of standards, such as the JESD245B.01 standard.

In an example, the set of attributes has a single member that corresponds to page zero. In an example, members of the set of attributes are addresses with a page designator of zero, and one of an offset that corresponds to NVDIMM_FUNC_CMD, ARM_CMD, FIRMWARE_OPS_CMD, or OPERATIONAL_UNIT_OPS_CMD in accordance with the Joint Electron Device Engineering Council (JEDEC) Byte Addressable Energy Backed Interface (BAEBI) JESD245B.01 standard. Thus, these commands are identified by the decoder 135 or controller 125 by the offset in the host's command address because all of these commands are on page zero. Accordingly, the table 135 can be a list of the offsets corresponding to these commands.

Once the decoder 135 or controller 125 determine that the command sent from the host 105 corresponds to an advertised status (e.g., an "in operation" indication), the advertised status is set. In an example, the advertised status is modified before the decoder 135 provides the decoded message to components of the controller 125. This ensures that the advertised status is modified (e.g., correctly set) prior to anything else being done, ensuring the fastest response by the controller 125 in setting the advertised status. In an example, the advertised status modified at the same time the decoded message contents are provided to the controller 125. Here, if the decoder 135 simply sets controller registers based on the message, the advertised status register is set at the same time as the registers specified in the message. In this context, simultaneously or same time means that no observer (such as the host 105 or the controller 125) can perceive a difference in register writing, even though one register can in fact be written before another.

In an example, the advertised status is modified by setting a register. In an example, setting the register includes setting exactly one bit in the register. In this example, the register can be read first, the desired bit modified, and the complete register written back by the host 105. In an example, exactly two bits in the register are modified to set the advertised status. In an example, exactly one bit being set indicates that an operation is in progress. In an example, exactly two bits being set indicate both that an operation is in progress (one of the two bits) and a designation for the operation (the second of the two bits). Here, the operation designation is the type of operation, such as a command name, command family, etc. In an example, the register has an address of one of page zero-offset 0x61, or page zero-offset 0x62.

The NVDIMM 110 can optionally include a power source 150 separate from host power. The power source 150 can be incorporated into the NVDIMM package, or connected to the NVDIMM package (as illustrated). The power source 150 can provide power to enable the controller 125 to move data from the volatile portion 130 to the non-volatile portion 145 in case of host power failure.

Figure 2:
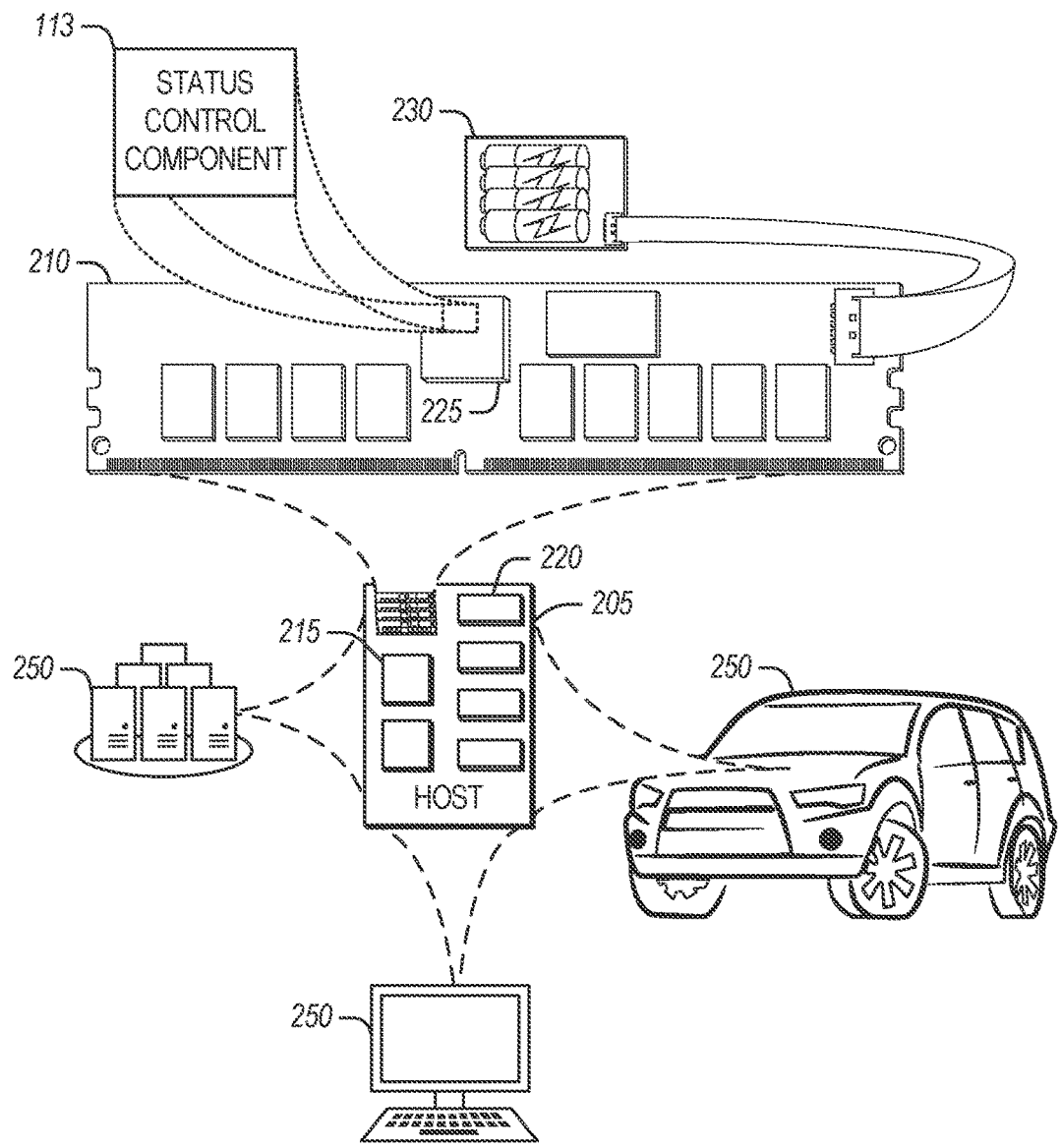
FIG. 2 illustrates an example of an environment including a system for status management in a storage backed memory package, in accordance with some implementations of the present disclosure.

The controller 125 or decoder 135 described above addresses the race condition issues that are present in storage backed memory packages used in systems today, including those described with respect to FIG. 2. By removing controller 125 delay when executing firmware to set the advertised status, and building, for example, the attribute-to-advertised status checking into the decoder 130, the NVDIMM 110 ensures that the advertised status is set before the host 105 can attempt a first read of the advertised status.

FIG. 2 illustrates an example of an environment 200 including a system for status management in a storage backed memory package 210, in accordance with some implementations of the present disclosure. The environment 200 includes a host device 205 and the storage backed memory package 210. The host device 205 or the storage backed memory package 210 can be included in a variety of products 250, such as data center servers, personal computers, or Internet of Things (IoT) devices (e.g., a refrigerator or other appliance, sensor, motor or actuator, mobile communication device, automobile, drone, etc.) to support processing, communications, or control of the product 250. The system can be the storage backed memory package 210, or a component of the storage backed memory package 210 such as the on-package controller 225. The system can also include a memory controller 220 or a processor 215 of the host device 205.

One or more communication interfaces can be used to transfer data between the storage backed memory package 210 and one or more other components of the host device 205, such as the processor 215. In an example, DDR4 is an implemented communication interface. In an example, I2C is an implemented communication interface. The host device 205 can include a host system, an electronic device, a memory card reader, or one or more other electronic devices external to the storage backed memory package 210. In some examples, the host 205 can be a machine having some portion, or all, of the components discussed in reference to the machine 500 of FIG. 5.

The processor 215 (which can be referred to as the host) generally directs or coordinates the activities of the host device 205 and the included components. The memory controller 220 supports memory activities, including use of the storage backed memory package 210, by components of the host device 205. The memory controller 220 can provide data addressing, and command coordination to the storage backed memory package 210. These activities can include data transfers to (e.g., write or erase) or from (e.g., read) one or more of the chips, ranks, or banks of the volatile portions of the storage backed memory package 210. The memory controller 215 can include, among other things, circuitry or firmware, including one or more components or integrated circuits. For example, the memory controller 215 can include one or more memory control units, circuits, or components configured to control access across the storage backed memory package 210 and to provide a translation layer between the host 205 and the storage backed memory package 210. The memory controller 215 can include one or more input/output (I/O) circuits, lines, or interfaces to transfer data to or from the storage backed memory package 210.

The memory controller 215 can include, among other things, circuitry or firmware, such as a number of components or integrated circuits associated with various memory management functions, such as de-fragmentation, or the status management techniques described herein (e.g., the status management component 113). The memory controller 215 can parse or format host commands (e.g., commands received from a host) into device commands (e.g., commands associated with operation of a memory array, etc.), or generate device commands (e.g., to accomplish various memory management functions) for the storage backed memory package 210 or one or more other components of the storage backed memory package 210.

The memory controller 215 can include, among other things, circuitry or components configured to control memory operations associated with writing data to, reading data from, or erasing one or more memory cells of the storage backed memory package 210. The memory operations can be based on, for example, host commands received from the host 205, or internally generated by the memory controller 215 (e.g., in association with defragmentation, error correction, refresh, etc.). The memory controller 215 can include code or logic to communicate using a standardized protocol (or features from a standardized protocol), such as GDDR6.

The storage backed memory package 210 can include the on-package controller 225 in addition to a volatile memory (e.g., DRAM or SRAM) and a non-volatile portion (e.g., flash). The storage backed memory package 210 can also include an on-board power source, or external power source 230, such as an electric double-layer capacitor (e.g., ELDC, supercapacitor, supercap, ultracapacitor, ultracap, etc.), battery, etc. The power source 230 can be independent of other host power sources and enable the on-package controller 225 to transfer data from volatile portions of the storage backed memory package 210 to non-volatile portions of the storage backed memory package 210 when host power fails. The on-package controller 225 can also move data from the non-volatile portions to the volatile portions (e.g., upon host power recovery) or provide access to the non-volatile portions directly. This last ability can enable greater error analysis during a host crash, for example, than is possible with standard system memory devices.

Figure 3:
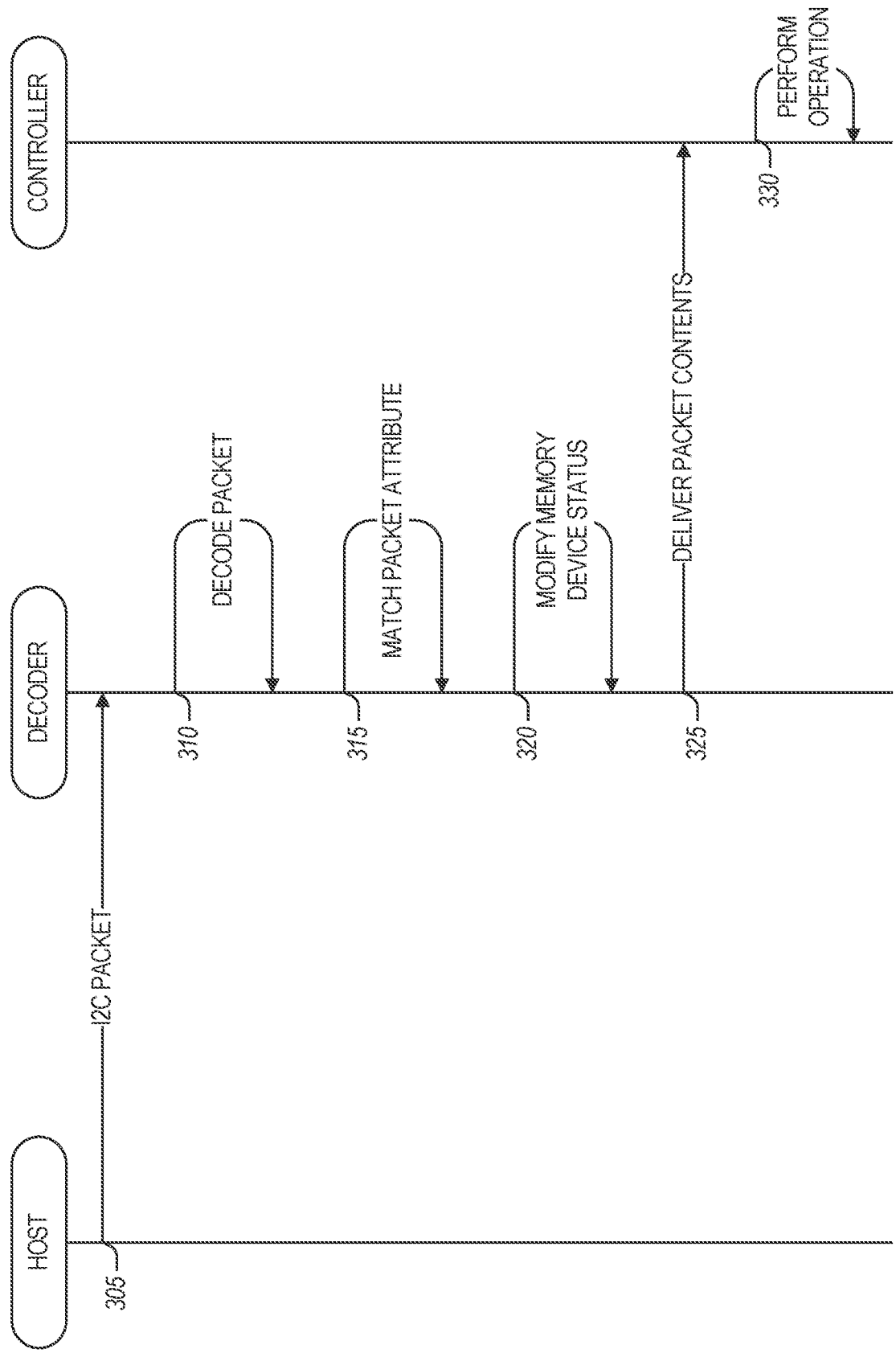
FIG. 3 illustrates an example component messaging to implement status management in a storage backed memory package, in accordance with some implementations of the present disclosure.

FIG. 3 illustrates an example component messaging to implement status management in a storage backed memory package, in accordance with some implementations of the present disclosure. The illustrated HOST, DECODER, and CONTROLLER components are similar to those described above. In an example, the DECODER is an I2C bus interface of the CONTROLLER. In this example, the illustrated message flows distinguish between the DECODER portion of the CONTROLLER and other portions of the CONTROLLER, such as those executing firmware to perform other actions.

Generally, the race condition solution involves hardware setting "Operation in Progress" bits immediately upon receipt of an I2C command. When the CONTROLLER has completed the operation in question, the CONTROLLER will clear the bits.

The HOST writes to certain command registers to communicate to the CONTROLLER (message 305). The DECODER decodes the I2C packet (operation 310), matches a packet attribute to a list to determine that an "Operation in Progress" status register bit is implicated by the command (operation 315) and preemptively sets appropriate bits in the corresponding status registers (operation 320). In an example, setting the appropriate bits includes setting a busy bit (e.g., bit 0) and an appropriate status bit. For example, from the JEDEC BAEBI standard:
   NVDIMM_FUNC_CMD [x43], ARM_CMD [x45],
   FIRMWARE_OPS_CMD [x4A], OPERATIONAL_UNIT_OPS_CMD   [x4B]→NVDIMM_CMD_STATUS1 [x62]; or
   ES_FUNC_CMD0 [0x30]→ES_CMD_STATUS0[0x50]

Once the status bits are set, the command is given over the rest of the CONTROLLER (message 325). In an example, this entails setting the status bits along with the registers specified in the I2C packet. In this example, the DECODER can signal the rest of the CONTROLLER with an interrupt, or the CONTROLLER can simply poll the registers for changes.

Once control has moved from the DECODER to the CONTROLLER, the CONTROLLER performs the command (operation 330), including setting correct status bits during, or after, the command is completed.

The messaging and control flow illustrated here addresses timing issues between the HOST and the CONTROLLER that can lead to unexpected results in a variety of operations. Several NVDIMM operations are critical and required by the HOST and the CONTROLLER to conform to the JEDEC BAEBI standards. In these operations, the HOST can issue a command (e.g., over the I2C interface) and checks a status register bit to determine when the command is complete. However, the BAEBI standard does not specify timing (e.g., a maximum time to complete) between command receipt and setting the status register. In some circumstances, the CONTROLLER doesn't get around to setting the bit before the HOST looks at the bit.

This issue is resolved by the illustrated flow. The DECODER set the status register bit based on the incoming request without waiting for the CONTROLLER (e.g., firmware running on the CONTROLLER) to do it. In a sense, the DECODER "snoops" the incoming command to determine which, if any, status register bit should be set. Once the DECODER observes a certain command, the DECODER sets the corresponding "I'm busy bit". Because the BAEBI standard specifies a memory map of memory pages (e.g., register locations) that the CONTROLLER is required to implement, the DECODER can perform the snoop by matching an incoming address (e.g., register and page offset within the register) to a list of address for commands with status bits. If the memory address matches a table entry, it has a status bit. For example, the page address of zero and offset in the page of forty-three identifies NVDIMM_FUNC_CMD. In an example, the data (e.g., payload) of the I2C packet can have additional information that can be used for other status bits.

In an example, the lookup table is a register in the DECODER (e.g., when implemented as an ASIC, the table is within the ASIC). In an example, the lookup table is in a memory shared with the CONTROLLER.

Figure 4:
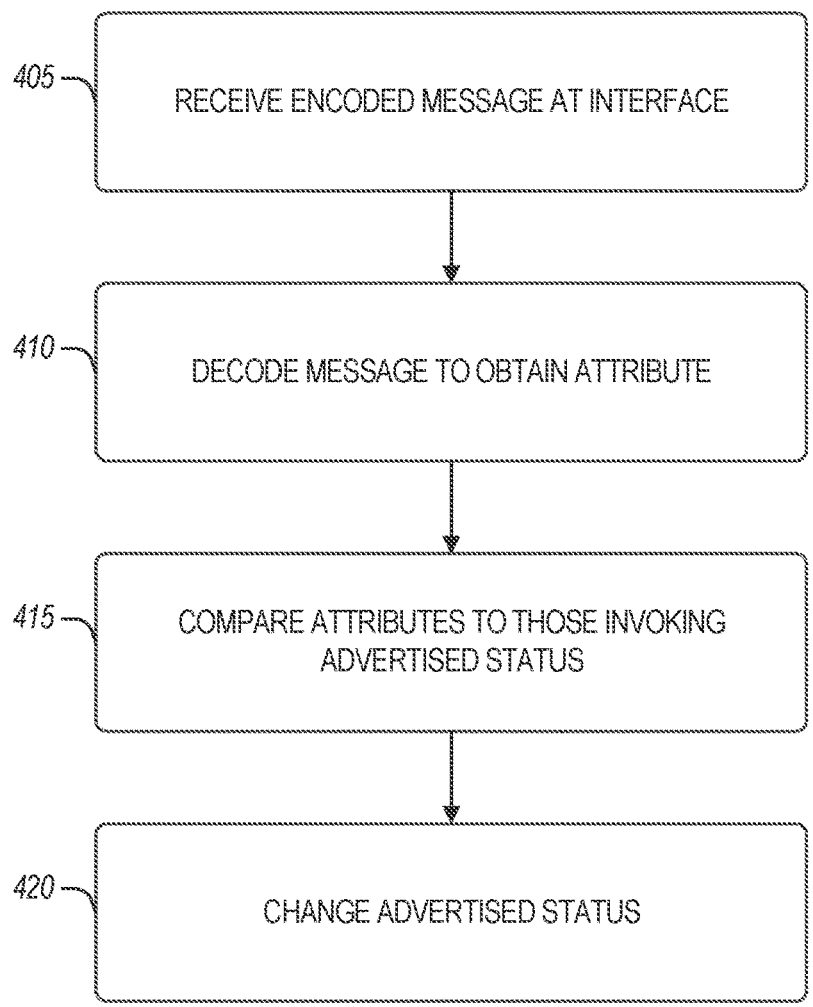
FIG. 4 illustrates an example flowchart of a method for status management in a storage backed memory package, in accordance with some implementations of the present disclosure.

FIG. 4 illustrates an example flowchart of a method 400 for status management in a storage backed memory package, in accordance with some implementations of the present disclosure. The operations of the method 400 are implemented in electronic hardware, such as that described above with respect to FIGS. 1-2 and below with respect to FIG. 5 (e.g., in circuitry).

At operation 405, an encoded message is received at a first interface of a memory package. Here, the memory package also includes a second interface to a host. In an example, the first interface is a bus that operates in accordance with an I2C family of standards. In an example, the second interface is a DDR (e.g., DDR4) RAM interface. In an example, the memory package is a NVDIMM. In an example, the NVDIMM is a NVDIMM-N type in accordance with a JEDEC family of standards.

At operation 410, the message is decoded to obtain a decoded message that includes an attribute. In an example, the attribute is a name of a command. In an example, the attribute is an address. In an example, the address a page designator. In an example, the address includes both a page designator and an offset.

At operation 415, the attribute is compared to a set of attributes that correspond to an advertised status of the memory package to determine that the attribute is in the set of attributes. In an example, the advertised status indicates whether there is an operation in progress for the memory controller. In an example, the advertised status also indicates a type of the operation in progress.

In an example, the set of attributes are stored in a table. Here, comparing the attribute to the set of attributes involves matching the attribute to a record in the table to determine that the attribute is in the set of attributes. In an example, the set of attributes are defined by a JEDEC BAEBI family of standards. In an example, the JEDEC BAEBI family of standards include a JESD245B.01 standard.

In an example, the set of attributes has a single member that corresponds to page zero. In an example, members of the set of attributes are addresses with a page designator of zero, and one of an offset that corresponds to NVDIMM_FUNC_CMD, ARM_CMD, FIRMWARE_OPS_CMD, or OPERATIONAL_UNIT_OPS_CMD in accordance with the JEDEC BAEBI JESD245B.01 standard. In an example, the set of attributes has a single member that corresponds to page one (e.g., page one registers for an energy source health check). In an example, members of the set of attributes are addresses with a page designator of one, and one of an offset that corresponds to ES_FUNC_CMD0.

At operation 420, the advertised status of the memory package is modified in response to the determination that the attribute is in the set of attributes. In an example, the modification to the advertised status of the memory package occurs before a decoder of a memory controller included in the non-volatile memory package provides the decoded message to components of the memory controller.

In an example, modifying the advertised status of the memory package includes setting a register of the memory package. In an example, setting the register includes setting exactly one bit or exactly two bits in the register. In an example, the one-bit setting indicates that an operation is in progress. In an example, the two bits setting indicate both that an operation is in progress and a designation for the operation. In an example, the being set register has an address of one of: page zero-offset 0x61, or page zero-offset 0x62.

Figure 5:
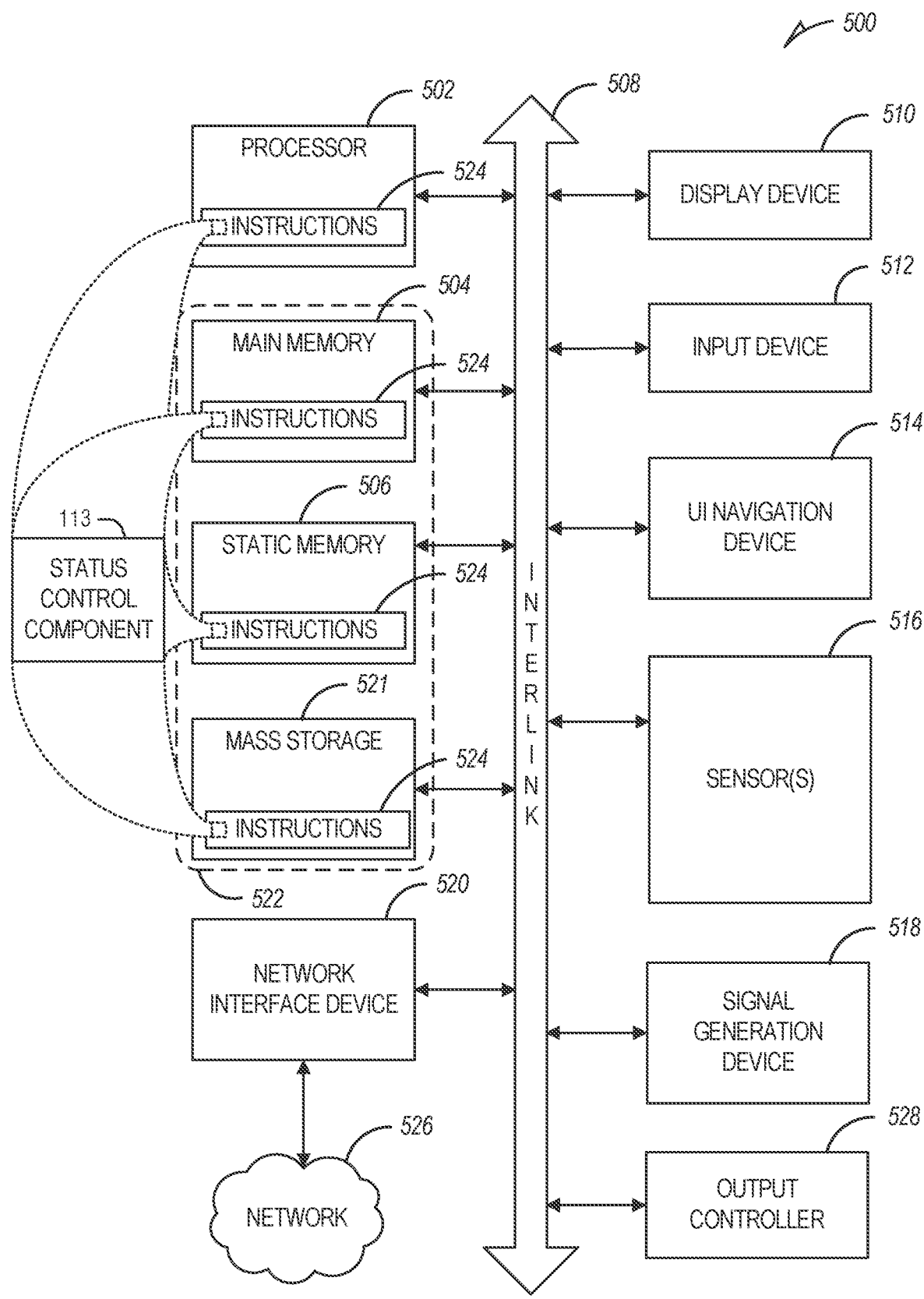
FIG. 5 is a block diagram illustrates an example computer system within which a set of instructions can be executed for causing the machine to perform any one or more of the methodologies discussed herein, according to implementations of the present disclosure.

FIG. 5 illustrates a block diagram of an example machine 500 upon which any one or more of the techniques (e.g., methodologies) discussed herein can perform. In alternative embodiments, the machine 500 can operate as a standalone device or can be connected (e.g., networked) to other machines. In a networked deployment, the machine 500 can operate in the capacity of a server machine, a client machine, or both in server-client network environments. In an example, the machine 500 can act as a peer machine in peer-to-peer (P2P) (or other distributed) network environment. The machine 500 can be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, can include, or can operate by, logic, components, devices, packages, or mechanisms. Circuitry (e.g., a circuit set, processing circuitry, etc.) is a collection (e.g., set) of circuits implemented in tangible entities that include hardware (e.g., simple circuits, gates, logic, etc.). Circuitry membership can be flexible over time and underlying hardware variability. Circuitries include members that can, alone or in combination, perform specific tasks when operating. In an example, hardware of the circuitry can be immutably designed to carry out a specific operation (e.g., hardwired). In an example, the hardware of the circuitry can include variably connected physical components (e.g., execution units, transistors, simple circuits, etc.) including a computer readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer readable medium is communicatively coupled to the other components of the circuitry when the device is operating. In an example, any of the physical components can be used in more than one member of more than one circuitry. For example, under operation, execution units can be used in a first circuit of a first circuitry at one point in time and reused by a second circuit in the first circuitry, or by a third circuit in a second circuitry at a different time.

The machine (e.g., computer system) 500 can include a hardware processor 502 (e.g., a CPU, a GPU, a hardware processor core, or any combination thereof), a main memory 504 and a static memory 506, some or all of which can communicate with each other via an interlink (e.g., bus) 508. The machine 500 can further include a display unit 510, an alphanumeric input device 512 (e.g., a keyboard), and a user interface (UI) navigation device 514 (e.g., a mouse). In an example, the display unit 510, input device 512, and UI navigation device 514 can be a touch screen display. The machine 500 can additionally include a signal generation device 518 (e.g., a speaker), a network interface device 520, and one or more sensors 516, such as a global positioning system (GPS) sensor, compass, accelerometer, or other sensor. The machine 500 can include an output controller 528, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The machine 500 can include one or more machine readable medium 522 on which is stored one or more sets of data structures or instructions 524 (e.g., software) embodying or utilized by any one or more of the techniques or functions described herein, such as the status control component 113. The machine readable medium 522 can include one or more of: main memory 524, static memory 506, and mass storage 521. The instructions 524 can reside, completely or at least partially, within the main memory 504, within static memory 506, mass storage 521 or within the hardware processor 502 during execution thereof by the machine 500. In an example, one or any combination of the hardware processor 502, the main memory 504, the static memory 506, or the mass storage 521 can constitute the machine readable medium 522.

While the machine readable medium 522 is illustrated as a single medium, the term "machine readable medium" can include a single medium or multiple media (e.g., a centralized or distributed database, or associated caches and servers) configured to store the one or more instructions 524.

The term "machine readable medium" can include any medium that is capable of storing, encoding, or carrying instructions for execution by the machine 500 and that cause the machine 500 to perform any one or more of the techniques of the present disclosure, or that is capable of storing, encoding or carrying data structures used by or associated with such instructions. Non-limiting machine readable medium examples can include solid-state memories, optical and magnetic media. In an example, a massed machine readable medium comprises a machine-readable medium with a plurality of particles having invariant (e.g., rest) mass. Accordingly, massed machine-readable media are not transitory propagating signals. Specific examples of massed machine readable media can include: non-volatile memory, such as semiconductor memory devices (e.g., EPROM, EEPROM) and flash memory devices; magnetic disks, such as internal hard disks and removable disks; magneto-optical disks; and CD-ROM and DVD-ROM disks.

The instructions 524 (e.g., software, programs, an operating system (OS), etc.) or other data are stored on the mass storage 521, can be accessed by the memory 504 for use by the processor 502. The memory 504 (e.g., DRAM) is typically fast, but volatile, and thus a different type of storage than the mass storage 521 (e.g., an SSD), which is suitable for long-term storage, including while in an "off" condition. The instructions 524 or data in use by a user or the machine 500 are typically loaded in the memory 504 for use by the processor 502. When the memory 504 is full, virtual space from the mass storage 521 can be allocated to supplement the memory 504; however, because the mass storage 521 device is typically slower than the memory 504, and write speeds are typically at least twice as slow as read speeds, use of virtual memory can greatly reduce user experience due to storage device latency (in contrast to the memory 504, e.g., DRAM). Further, use of the mass storage 521 for virtual memory can greatly reduce the usable lifespan of the mass storage 521.

In contrast to virtual memory, virtual memory compression (e.g., the Linux® kernel feature "ZRAM") uses part of the memory as compressed block storage to avoid paging to the mass storage 521. Paging takes place in the compressed block until it is necessary to write such data to the mass storage 521. Virtual memory compression increases the usable size of memory 504, while reducing wear on the mass storage 521.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host device, and are often removable and separate components from the host device. In contrast, eMMC™ devices are attached to a circuit board and considered a component of the host device, with read speeds that rival serial ATA™ (Serial AT (Advanced Technology) Attachment, or SATA) based SSD devices. However, demand for mobile device performance continues to increase, such as to fully enable virtual or augmented-reality devices, utilize increasing networks speeds, and the like. In response to this demand, storage devices have shifted from parallel to serial communication interfaces. Universal Flash Storage (UFS) devices, including controllers and firmware, communicate with a host device using a low-voltage differential signaling (LVDS) serial interface with dedicated read/write paths, further advancing greater read/write speeds.

The instructions 524 can further be transmitted or received over a communications network 526 using a transmission medium via the network interface device 520 utilizing any one of a number of transfer protocols (e.g., frame relay, internet protocol (IP), transmission control protocol (TCP), user datagram protocol (UDP), hypertext transfer protocol (HTTP), etc.). Example communication networks can include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 520 can include one or more physical jacks (e.g., Ethernet, coaxial, or phone jacks) or one or more antennas to connect to the communications network 526. In an example, the network interface device 520 can include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 500, and includes digital or analog communications signals or other intangible medium to facilitate communication of such software.

ADDITIONAL EXAMPLES

Example 1 is a memory package for status management in a storage backed memory package, the memory package comprising: a volatile portion; a non-volatile portion; a first interface to receive an encoded message; a second interface to communicate with a host; and a decoder of the first interface, the decoder to: decode the message to obtain a decoded message that includes, an attribute; compare the attribute to a set of attributes that correspond to an advertised status of the memory package to determine that the attribute is in the set of attributes; and modify the advertised status of the memory package in response to the determination that the attribute is in the set of attributes.

In Example 2, the subject matter of Example 1 includes, wherein the first interface is a bus that operates in accordance with an I2C family of standards.

In Example 3, the subject matter of Examples 1-2 includes, wherein the second interface is a double data rate (DDR) random-access memory (RAM) interface.

In Example 4, the subject matter of Example 3 includes, wherein the memory package is a non-volatile dual in-line memory module (NVDIMM).

In Example 5, the subject matter of Example 4 includes, wherein the NVDIMM is a NVDIMM-N type in accordance with a Joint Electron Device Engineering Council (JEDEC) family of standards.

In Example 6, the subject matter of Examples 1-5 includes, a memory controller, wherein, the decoder is to modify the advertised status of the memory package before the decoder provides the decoded message to components of the memory controller.

In Example 7, the subject matter of Examples 1-6 includes, wherein, to modify the advertised status of the memory package, the decoder sets a register of the memory package.

In Example 8, the subject matter of Example 7 includes, wherein, to set the register, the decoder sets exactly one bit in the register, or exactly two bits in the register, wherein the one bit indicates an operation in progress and the two bits indicate both that an operation is in progress and a designation for the operation.

In Example 9, the subject matter of Examples 7-8 includes, wherein the register has an address of one of page zero-offset 0x61, or page zero-offset 0x62.

In Example 10, the subject matter of Examples 1-9 includes, a memory controller, wherein the advertised status indicates whether there is an operation in progress for the memory controller.

In Example 11, the subject matter of Example 10 includes, wherein the advertised status also indicates a type of the operation in progress.

In Example 12, the subject matter of Examples 1-11 includes, wherein the set of attributes are defined by a Joint Electron Device Engineering Council (JEDEC) Byte Addressable Energy Backed Interface (BAEBI) family of standards.

In Example 13, the subject matter of Example 12 includes, wherein the JEDEC BAEBI family of standards include a JESD245B.01 standard.

In Example 14, the subject matter of Examples 1-13 includes, wherein the attribute is a name of a command.

In Example 15, the subject matter of Examples 1-14 includes, wherein the attribute is an address.

In Example 16, the subject matter of Example 15 includes, wherein the address is a page designator.

In Example 17, the subject matter of Example 16 includes, wherein the set of attributes has a single member that corresponds to page zero.

In Example 18, the subject matter of Examples 15-17 includes, wherein the address includes both a page designator and an offset.

In Example 19, the subject matter of Example 18 includes, wherein members of the set of attributes are addresses with a page designator of zero, and one of an offset that corresponds to NVDIMM_FUNC_CMD, ARM_CMD, FIRMWARE_OPS_CMD, or OPERATIONAL_UNIT_OPS_CMD in accordance with the Joint Electron Device Engineering Council (JEDEC) Byte Addressable Energy Backed Interface (BAEBI) JESD245B.01 standard.

In Example 20, the subject matter of Examples 1-19 includes, wherein the set of attributes are stored in a table, and wherein comparing the attribute to the set of attributes includes matching the attribute to a record in the table to determine that the attribute is in the set of attributes.

Example 21 is a method for status management in a storage backed memory package, the method comprising: receiving, at a first interface of the memory package, an encoded message, the memory package including a second interface to a host; decoding the message to obtain a decoded message that includes, an attribute; comparing the attribute to a set of attributes that correspond to an advertised status of the memory package to determine that the attribute is in the set of attributes; and modifying the advertised status of the memory package in response to the determination that the attribute is in the set of attributes.

In Example 22, the subject matter of Example 21 includes, wherein the first interface is a bus that operates in accordance with an I2C family of standards.

In Example 23, the subject matter of Examples 21-22 includes, wherein the second interface is a double data rate (DDR) random-access memory (RAM) interface.

In Example 24, the subject matter of Example 23 includes, wherein the memory package is a non-volatile dual in-line memory module (NVDIMM).

In Example 25, the subject matter of Example 24 includes, wherein the NVDIMM is a NVDIMM-N type in accordance with a Joint Electron Device Engineering Council (JEDEC) family of standards.

In Example 26, the subject matter of Examples 21-25 includes, wherein modifying the advertised status of the memory package occurs before a decoder of a memory controller included in the non-volatile memory package provides the decoded message to components of the memory controller.

In Example 27, the subject matter of Examples 21-26 includes, wherein modifying the advertised status of the memory package includes setting a register of the memory package.

In Example 28, the subject matter of Example 27 includes, wherein setting the register includes setting exactly one bit in the register, or exactly two bits in the register, wherein the one bit indicates an operation in progress and the two bits indicate both that an operation is in progress and a designation for the operation.

In Example 29, the subject matter of Examples 27-28 includes, wherein the register has an address of one of page zero-offset 0x61, or page zero-offset 0x62.

In Example 30, the subject matter of Examples 21-29 includes, wherein the advertised status indicates whether there is an operation in progress for a memory controller included in the non-volatile memory package.

In Example 31, the subject matter of Example 30 includes, wherein the advertised status also indicates a type of the operation in progress.

In Example 32, the subject matter of Examples 21-31 includes, wherein the set of attributes are defined by a Joint Electron Device Engineering Council (JEDEC) Byte Addressable Energy Backed Interface (BAEBI) family of standards.

In Example 33, the subject matter of Example 32 includes, wherein the JEDEC BAEBI family of standards include a JESD245B.01 standard.

In Example 34, the subject matter of Examples 21-33 includes, wherein the attribute is a name of a command.

In Example 35, the subject matter of Examples 21-34 includes, wherein the attribute is an address.

In Example 36, the subject matter of Example 35 includes, wherein the address is a page designator.

In Example 37, the subject matter of Example 36 includes, wherein the set of attributes has a single member that corresponds to page zero.

In Example 38, the subject matter of Examples 35-37 includes, wherein the address includes both a page designator and an offset.

In Example 39, the subject matter of Example 38 includes, wherein members of the set of attributes are addresses with a page designator of zero, and one of an offset that corresponds to NVDIMM_FUNC_CMD, ARM_CMD, FIRMWARE_OPS_CMD, or OPERATIONAL_UNIT_OP-S_CMD in accordance with the Joint Electron Device Engineering Council (JEDEC) Byte Addressable Energy Backed Interface (BAEBI) JESD245B.01 standard.

In Example 40, the subject matter of Examples 21-39 includes, wherein the set of attributes are stored in a table, and wherein comparing the attribute to the set of attributes includes matching the attribute to a record in the table to determine that the attribute is in the set of attributes.

Example 41 is at least one machine readable medium including instructions for status management in a storage backed memory package, the instructions, when executed by processing circuitry or the memory package, cause the memory package to perform operations comprising: receiving, at a first interface of the memory package, an encoded message, the memory package including a second interface to a host; decoding the message to obtain a decoded message that includes, an attribute; comparing the attribute to a set of attributes that correspond to an advertised status of the memory package to determine that the attribute is in the set of attributes; and modifying the advertised status of the memory package in response to the determination that the attribute is in the set of attributes.

In Example 42, the subject matter of Example 41 includes, wherein the first interface is a bus that operates in accordance with an I2C family of standards.

In Example 43, the subject matter of Examples 41-42 includes, wherein the second interface is a double data rate (DDR) random-access memory (RAM) interface.

In Example 44, the subject matter of Example 43 includes, wherein the memory package is a non-volatile dual in-line memory module (NVDIMM).

In Example 45, the subject matter of Example 44 includes, wherein the NVDIMM is a NVDIMM-N type in accordance with a Joint Electron Device Engineering Council (JEDEC) family of standards.

In Example 46, the subject matter of Examples 41-45 includes, wherein modifying the advertised status of the memory package occurs before a decoder of a memory controller included in the non-volatile memory package provides the decoded message to components of the memory controller.

In Example 47, the subject matter of Examples 41-46 includes, wherein modifying the advertised status of the memory package includes setting a register of the memory package.

In Example 48, the subject matter of Example 47 includes, wherein setting the register includes setting exactly one bit in the register, or exactly two bits in the register, wherein the one bit indicates an operation in progress and the two bits indicate both that an operation is in progress and a designation for the operation.

In Example 49, the subject matter of Examples 47-48 includes, wherein the register has an address of one of page zero-offset 0x61, or page zero-offset 0x62.

In Example 50, the subject matter of Examples 41-49 includes, wherein the advertised status indicates whether there is an operation in progress for a memory controller included in the non-volatile memory package.

In Example 51, the subject matter of Example 50 includes, wherein the advertised status also indicates a type of the operation in progress.

In Example 52, the subject matter of Examples 41-51 includes, wherein the set of attributes are defined by a Joint Electron Device Engineering Council (JEDEC) Byte Addressable Energy Backed Interface (BAEBI) family of standards.

In Example 53, the subject matter of Example 52 includes, wherein the JEDEC BAEBI family of standards include a JESD245B.01 standard.

In Example 54, the subject matter of Examples 41-53 includes, wherein the attribute is a name of a command.

In Example 55, the subject matter of Examples 41-54 includes, wherein the attribute is an address.

In Example 56, the subject matter of Example 55 includes, wherein the address is a page designator.

In Example 57, the subject matter of Example 56 includes, wherein the set of attributes has a single member that corresponds to page zero.

In Example 58, the subject matter of Examples 55-57 includes, wherein the address includes both a page designator and an offset.

In Example 59, the subject matter of Example 58 includes, wherein members of the set of attributes are addresses with a page designator of zero, and one of an offset that corresponds to NVDIMM_FUNC_CMD, ARM_CMD, FIRMWARE_OPS_CMD, or OPERATIONAL_UNIT_OP-S_CMD in accordance with the Joint Electron Device Engineering Council (JEDEC) Byte Addressable Energy Backed Interface (BAEBI) JESD245B.01 standard.

In Example 60, the subject matter of Examples 41-59 includes, wherein the set of attributes are stored in a table, and wherein comparing the attribute to the set of attributes includes matching the attribute to a record in the table to determine that the attribute is in the set of attributes.

Example 61 is a system for status management in a storage backed memory package, the system comprising: means for receiving, at a first interface of the memory package, an encoded message, the memory package including a second interface to a host; means for decoding the message to obtain a decoded message that includes, an attribute; means for comparing the attribute to a set of attributes that correspond to an advertised status of the memory package to determine that the attribute is in the set of attributes; and means for modifying the advertised status of the memory package in response to the determination that the attribute is in the set of attributes.

In Example 62, the subject matter of Example 61 includes, wherein the first interface is a bus that operates in accordance with an I2C family of standards.

In Example 63, the subject matter of Examples 61-62 includes, wherein the second interface is a double data rate (DDR) random-access memory (RAM) interface.

In Example 64, the subject matter of Example 63 includes, wherein the memory package is a non-volatile dual in-line memory module (NVDIMM).

In Example 65, the subject matter of Example 64 includes, wherein the NVDIMM is a NVDIMM-N type in accordance with a Joint Electron Device Engineering Council (JEDEC) family of standards.

In Example 66, the subject matter of Examples 61-65 includes, wherein modifying the advertised status of the memory package occurs before a decoder of a memory controller included in the non-volatile memory package provides the decoded message to components of the memory controller.

In Example 67, the subject matter of Examples 61-66 includes, wherein the means for modifying the advertised status of the memory package include means for setting a register of the memory package.

In Example 68, the subject matter of Example 67 includes, wherein the means for setting the register include means for setting exactly one bit in the register, or exactly two bits in the register, wherein the one bit indicates an operation in progress and the two bits indicate both that an operation is in progress and a designation for the operation.

In Example 69, the subject matter of Examples 67-68 includes, wherein the register has an address of one of page zero-offset 0x61, or page zero-offset 0x62.

In Example 70, the subject matter of Examples 61-69 includes, wherein the advertised status indicates whether there is an operation in progress for a memory controller included in the non-volatile memory package.

In Example 71, the subject matter of Example 70 includes, wherein the advertised status also indicates a type of the operation in progress.

In Example 72, the subject matter of Examples 61-71 includes, wherein the set of attributes are defined by a Joint Electron Device Engineering Council (JEDEC) Byte Addressable Energy Backed Interface (BAEBI) family of standards.

In Example 73, the subject matter of Example 72 includes, wherein the JEDEC BAEBI family of standards include a JESD245B.01 standard.

In Example 74, the subject matter of Examples 61-73 includes, wherein the attribute is a name of a command.

In Example 75, the subject matter of Examples 61-74 includes, wherein the attribute is an address.

In Example 76, the subject matter of Example 75 includes, wherein the address is a page designator.

In Example 77, the subject matter of Example 76 includes, wherein the set of attributes has a single member that corresponds to page zero.

In Example 78, the subject matter of Examples 75-77 includes, wherein the address includes both a page designator and an offset.

In Example 79, the subject matter of Example 78 includes, wherein members of the set of attributes are addresses with a page designator of zero, and one of an offset that corresponds to NVDIMM_FUNC_CMD, ARM_CMD, FIRMWARE_OPS_CMD, or OPERATIONAL_UNIT_OPS_CMD in accordance with the Joint Electron Device Engineering Council (JEDEC) Byte Addressable Energy Backed Interface (BAEBI) JESD245B.01 standard.

In Example 80, the subject matter of Examples 61-79 includes, wherein the set of attributes are stored in a table, and wherein comparing the attribute to the set of attributes includes matching the attribute to a record in the table to determine that the attribute is in the set of attributes.

Example 81 is at least one machine-readable medium including instructions that, when executed by processing circuitry, cause the processing circuitry to perform operations to implement of any of Examples 1-80.

Example 82 is an apparatus comprising means to implement of any of Examples 1-80.

Example 83 is a system to implement of any of Examples 1-80.

Example 84 is a method to implement of any of Examples 1-80.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" can include "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Operating a memory cell, as used herein, includes reading from, writing to, or erasing the memory cell. The operation of placing a memory cell in an intended state is referred to herein as "programming," and can include both writing to or erasing from the memory cell (e.g., the memory cell can be programmed to an erased state).

It will be understood that when an element is referred to as being "on," "connected to," or "coupled with" another element, it can be directly on, connected, or coupled with the other element or intervening elements can be present. In contrast, when an element is referred to as being "directly on," "directly connected to" or "directly coupled with" another element, there are no intervening elements or layers present. If two elements are shown in the drawings with a line connecting them, the two elements can be either be coupled, or directly coupled, unless otherwise indicated.

The above description is intended to be illustrative, and not restrictive. For example, the above-described examples (or one or more aspects thereof) can be used in combination with each other. Other embodiments can be used, such as by one of ordinary skill in the art upon reviewing the above description. It is submitted with the understanding that it will not be used to interpret or limit the scope or meaning of the claims. Also, in the above Detailed Description, various features can be grouped together to streamline the disclosure. This should not be interpreted as intending that an unclaimed disclosed feature is essential to any claim. Rather, inventive subject matter can lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A memory system comprising:
   a memory controller;

an interface for communication between the memory controller and a host; and a decoder coupled to the interface, the decoder configured to perform operations comprising:

prior to providing to the memory controller a decoded message that comprises a request to write to a command register of the memory controller:

inspecting the decoded message to determine whether the request to write to the command register is associated with an operation that corresponds to an advertised status of the memory system, the inspecting of the decoded message comprising determining whether a message attribute of the decoded message is in a set of attributes that corresponds to the advertised status, and the advertised status being accessible by the host via the interface; and modifying the advertised status of the memory system in response to determining that the message attribute is in the set of attributes; and providing the decoded message to the memory controller for executing the request.

2. The memory system of claim 1, wherein the interface comprises an Inter-Integrated Circuit (I2C) bus.

3. The memory system of claim 1, wherein the memory system is part of a non-volatile dual in-line memory module (NVDIMM).

4. The memory system of claim 1, wherein the advertised status indicates whether the operation in progress for the memory controller.

5. The memory system of claim 1, wherein the set of attributes are defined by a Joint Electron Device Engineering Council (JEDEC) Byte Addressable Energy Backed Interface (BAEBI) family of standards.

6. The memory system of claim 1, wherein the message attribute is an address.

7. The memory system of claim 6, wherein the address is a page designator.

8. A method comprising:

prior to providing to a memory controller of a memory system a decoded message that comprises a request to write to a command register of the memory controller:

inspecting the decoded message to determine whether the request to write to the command register is associated with an operation that corresponds to an advertised status of the memory system, the inspecting the decoded message comprising determining whether a message attribute of the decoded message is in a set of attributes that corresponds to the advertised status, and the advertised status being accessible by a host; and modifying the advertised status of the memory system in response to determining that the message attribute is in the set of attributes; and providing the decoded message to the memory controller for executing the request.

9. The method of claim 8, wherein the advertised status is accessible by the host via an interface of the memory system, the interface comprising an Inter-Integrated Circuit (I2C) bus.

10. The method of claim 8, wherein the memory system is part of a non-volatile dual in-line memory module (NVDIMM).

11. The method of claim 8, wherein the advertised status indicates whether the operation in progress for the memory controller.

12. The method of claim 8, wherein the set of attributes are defined by a Joint Electron Device Engineering Council (JEDEC) Byte Addressable Energy Backed Interface (BAEBI) family of standards.

13. The method of claim 8, wherein the message attribute is an address.

14. The method of claim 13, wherein the address is a page designator.

15. At least one non-transitory machine readable medium including instructions, when executed by processing circuitry of a memory system, cause the memory system to perform operations comprising:

prior to providing to a memory controller of the memory system a decoded message that comprises a request to write to a command register of the memory controller:

inspecting the decoded message to determine whether the request to write to the command register is associated with an operation that corresponds to an advertised status of the memory system, the inspecting the decoded message comprising determining whether a message attribute of the decoded message is in a set of attributes that corresponds to the advertised status, and the advertised status being accessible by a host; and modifying the advertised status of the memory system in response to determining that the message attribute is in the set of attributes; and providing the decoded message to the memory controller for executing the request.

16. The at least one non-transitory machine readable medium of claim 15, wherein the advertised status is accessible by the host via an interface of the memory system, the interface comprising an Inter-Integrated Circuit (I2C) bus.

17. The at least one non-transitory machine readable medium of claim 15, wherein the memory system is part of a non-volatile dual in-line memory module (NVDIMM).

18. The at least one non-transitory machine readable medium of claim 15, wherein the advertised status indicates whether the operation in progress for the memory controller.

19. The at least one non-transitory machine readable medium of claim 15, wherein the message attribute is an address.

20. The at least one non-transitory machine readable medium of claim 19, wherein the address is a page designator.

* * * * *